United States Patent [19]

Ayers et al.

[11] 4,113,512
[45] Sep. 12, 1978

[54] TECHNIQUE FOR PREVENTING FORWARD BIASED EPI-ISOLATION DEGRADATION

[75] Inventors: Robert Lee Ayers, Manassas; Raymond Weaver Hamaker, Catharpin, both of Va.

[73] Assignee: International Business Machines Corporation, Armonk, N.Y.

[21] Appl. No.: 736,646

[22] Filed: Oct. 28, 1976

[51] Int. Cl.² ......................................... H01L 21/265
[52] U.S. Cl. ..................................... 148/1.5; 357/20; 357/47; 357/91
[58] Field of Search ..................... 357/20, 47, 50, 48; 148/1.5; 29/576 W

[56] References Cited

U.S. PATENT DOCUMENTS

| | | | |
|---|---|---|---|
| 3,551,760 | 12/1970 | Tokuyama | 317/235 R |
| 3,631,311 | 12/1971 | Engbert | 317/235 R |
| 3,653,988 | 4/1972 | Glinski | 148/175 |
| 3,697,827 | 10/1972 | Simon | 317/235 |
| 3,760,239 | 9/1973 | Fletcher et al. | 317/235 R |
| 3,964,705 | 6/1976 | Giovanni | 248/27 R |
| 4,021,270 | 5/1977 | Hunt et al. | 148/1.5 |

OTHER PUBLICATIONS

H. H. Berger et al., "Producing Reduced Inverse Beta Transistors", IBM TDB, 14 (1971) 752.

Primary Examiner—L. Dewayne Rutledge
Assistant Examiner—Upendra Roy
Attorney, Agent, or Firm—John E. Hoel

[57] ABSTRACT

Certain types of silicon integrated circuits are embodied as having diffused isolation regions surrounding epitaxial regions. Although normally operated in a reverse bias mode, such regions may become forward biased when sourcing current for certain circuit applications. Certain types of ionized impurities lodged in the isolation region can then migrate into the depletion region and the epitaxial region of the device during a forward bias condition. Such contaminants can be expected to produce generation-recombination centers in the depletion layer of the device which, when the isolation region is then reverse biased, will produce significant increases in junction leakage current. The magnitude of this reverse bias leakage current will depend upon both the contaminant concentration and the width of the depletion region.

9 Claims, 8 Drawing Figures

IMPROVED DEVICE STRUCTURE

DEVICE PROFILE AFTER ISOLATION DIFFUSION

IMPURITY PROFILE NEAR SURFACE (LATERAL)

DIFFUSION-LIMITED CONDITIONS IN ALL REGIONS $\varepsilon = 0$ IN ALL REGIONS

ACCELERATING DRIFT FIELD IN ISOLATION (P) REGION OF DEVICE

TECHNIQUE FOR PREVENTING FORWARD BIASED EPI-ISOLATION DEGRADATION

The leakage problem is prevented by adding the guard ring to the isolation region of the same conductivity type as the isolation region. The guard ring can be added at the time of the base diffusion in bipolar technology. The guard ring prevents an ohmic electric field from extending into the original isolation region where the ionic impurities are concentrated, preventing diffusion of the impurities into the epitaxial region.

FIELD OF THE INVENTION

The invention disclosed relates to semiconductor devices and more particularly relates to a technique for reducing epi-isolation degradation.

BACKGROUND OF THE INVENTION

In prior art of integrated circuits, it is well known metallic ionic impurities can reduce the minority carrier lifetime in silicon bipolar devices. This is thought to be due to a relatively uniform distribution of the metallic contaminant in the semiconductor. A seemingly unrelated phenomenon observed in the prior art is the gettering of metallic ionic contaminants in regions of a semiconductor which are highly doped with boron. See, for example, J. E. Lawrence, Trans. AIME 242,484 (1968). Further, it has been observed; e.g. F. Barson, et al *Fall Meeting of Electrochem. Society,* October, 1969, Abstract 196, that ionized copper will diffuse across a silicon PN junction when a forward bias is applied. Two types of copper were identified: Interstitial in the p region and substitution copper in the n region of the device.

It has also been recognized that zinc is a conventional substitutional acceptor dopant, for forming p-n junctions in GaAs semiconductors. The zinc in the p type region will undergo conversion to an interstitial donor under certain doping conditions. This interstitial zinc has an extremely high diffusivity, causing the zinc to move under field-enhanced diffusion, across the p-n junction. This unwanted diffusion of zinc in GaAs has been observed to cause excessive leakage current in both forward and reverse biased directions, (see Longini, *Solid State Electronics,* 5, 127 (1962)).

Recently forward biased isolation-epitaxy junctions, (for example, the isolation-collector junction in an NPN transistor), have been observed to degrade through the diffusion of heavy metal ions, in particular copper, across the junction. This is caused principally by the high concentration of copper present in the isolation region since it is well established that this region acts as a "getter" for copper due to the high solubility of copper in degenerate silicon as well as the high density of dislocations plus lattice strain therein. The contaminant will undergo field-enhanced diffusion caused by a reduction in the built-in junction field and by the electric field in the p type and n type regions due to the ohmic field in these contiguous regions when the junction is forward biased.

FIG. 1a shows a cross-sectional view of a p type isolation region 2, typically of boron at a concentration of greater than $10^{19}$ atoms/cc, in a n type silicon epitaxial layer 4, of arsenic at a concentration of $10^{15}$ atoms/cc. A metallic contaminant such as copper is "gettered" in the isolation region 2.

FIG. 1b shows the concentration profile of FIG. 1a for boron, arsenic and the copper contaminant under equilibrium conditions. The copper concentration is approximately two orders of magnitude less than that of boron, see for example, (Hall, et al, *Journal of Applied Physics,* 35, 379 (1964)).

FIG. 1c shows the transient behavior for the redistribution of the metallic contaminant of FIG. 1b, for the case of a strong forward biased junction with a negligible built-in field remaining in the depletion region and no fields present in either the p or n regions. FIG. 1c illustrates the general transient behavior for ionized impurity diffusion out of the p region of the device when a strong forward bias condition is applied to the junction. At steady-state, since no internal electric field is present, a uniform impurity concentration will exist in all regions of the device.

FIG. 1d shows the transient behavior for the redistribution of the metallic contaminant of FIG. 1b, for a lower forward bias condition than that for FIG. 1c, where the built-in junction field, $E_J$ has a significant magnitude. The amount of diffusion of the contaminant across the junction is less than that in the strongly forward biased case shown in FIG. 1c, due to the compensating effect of $E_J$. A general steady-state distribution of the contaminant as a function of several forward bias voltages is shown in FIG. 1e.

FIG. 1f illustrates a typical transient situation for a forward biased junction when the depletion region has a moderate retarding field, while the p region has an accelerating drift field. It should be noted that when steady-state conditions are attained, both regions still have concentration gradients since both drift and diffusion forces demand non-uniform concentrations. Under these conditions, more of the metallic contaminant will diffuse across the junction than that for FIG. 1d, but less than that for the strongly forward biased condition of FIG. 1c.

DESCRIPTION OF THE FIGURES

These and other objects, features and advantages of the invention will be more particularly appeciated with reference to the accompanying drawings.

FIG. 2b is a concentration gradient for the structures shown in FIG. 2a.

DISCUSSION OF THE PREFERRED EMBODIMENT

Figure 1A:
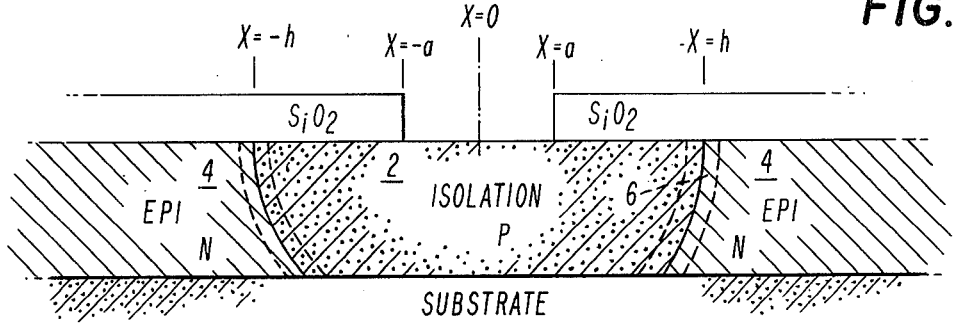
FIG. 1a shows a cross-sectional view of a p type isolation region in an n type silicon epitaxial layer.
Figure 1B:
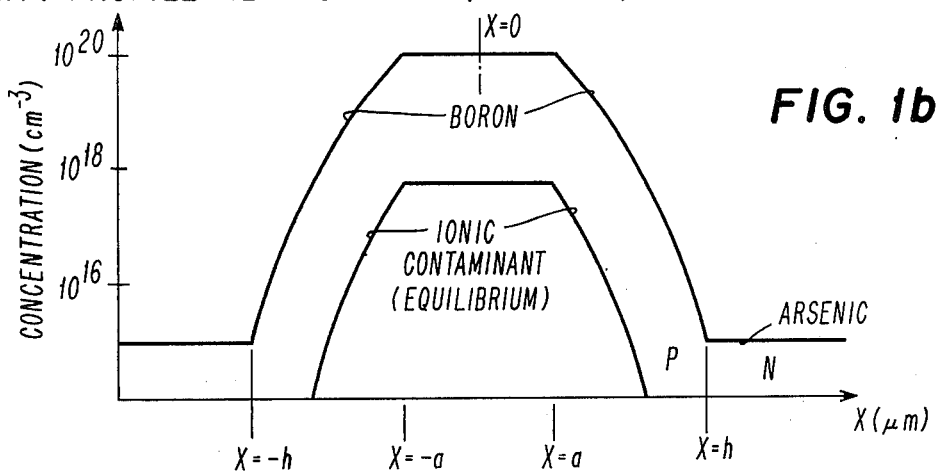
FIG. 1b shows the concentration profile of the structure of FIG. 1a, for boron, arsenic and a copper ionic contaminant at equilibrium.
Figure 1C:
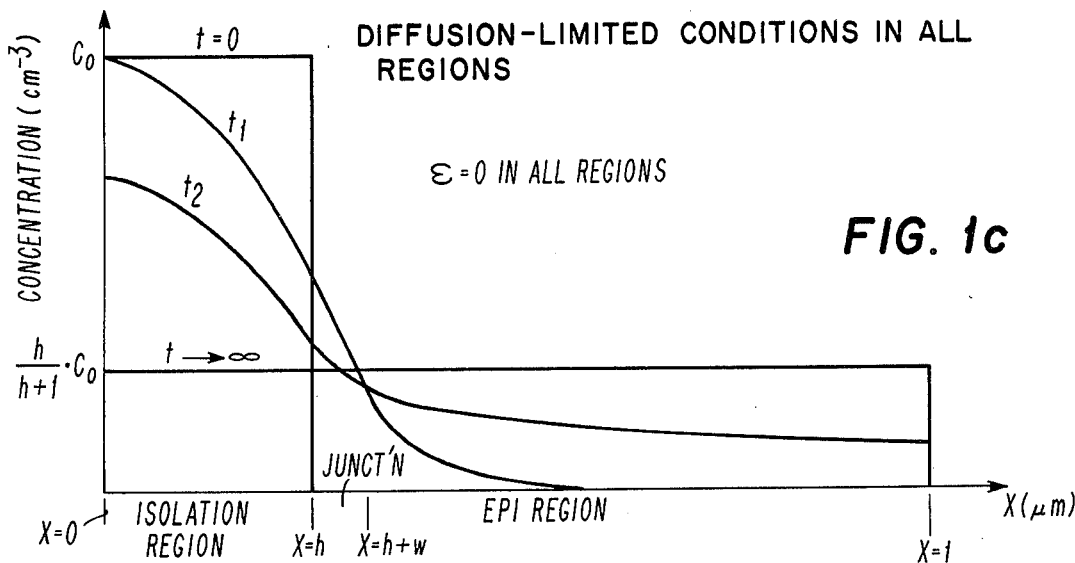
FIG. 1c shows the transient behavior of the metallic contaminant of FIG. 1b for a strong forward biased junction.
Figure 1D:
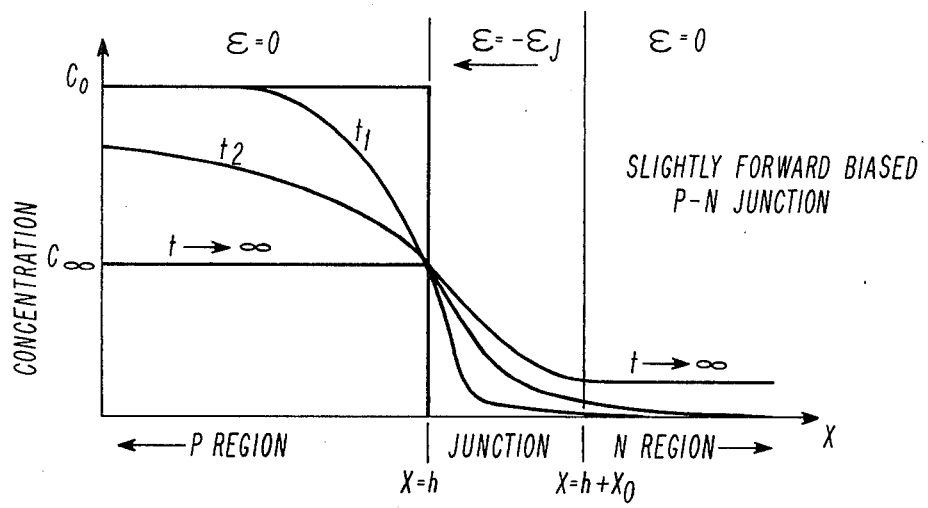
FIG. 1d shows the transient behavior of the metallic contaminant of FIG. 1b for a lower forward biased condition where the built-in junction field $E_J$ has a significant magnitude.
Figure 1E:
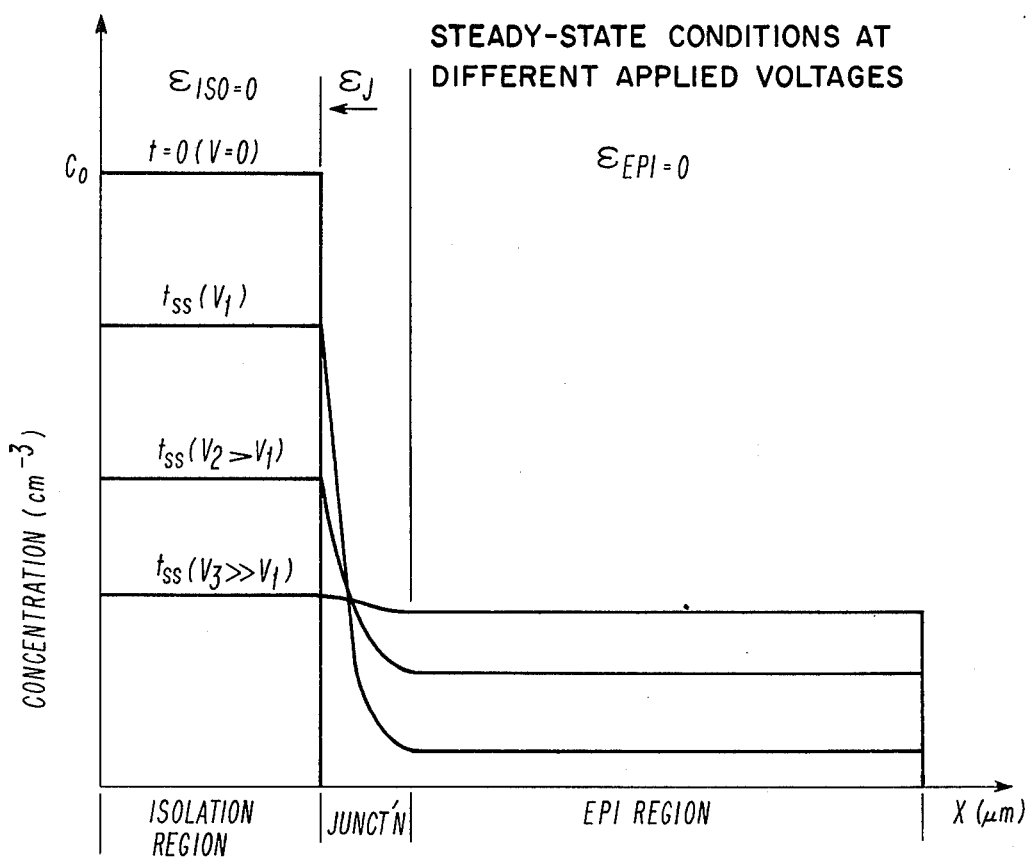
FIG. 1e is a general steady-state distribution diagram of the contaminant in FIG. 1b as a function of several forward biased voltages.
Figure 1F:
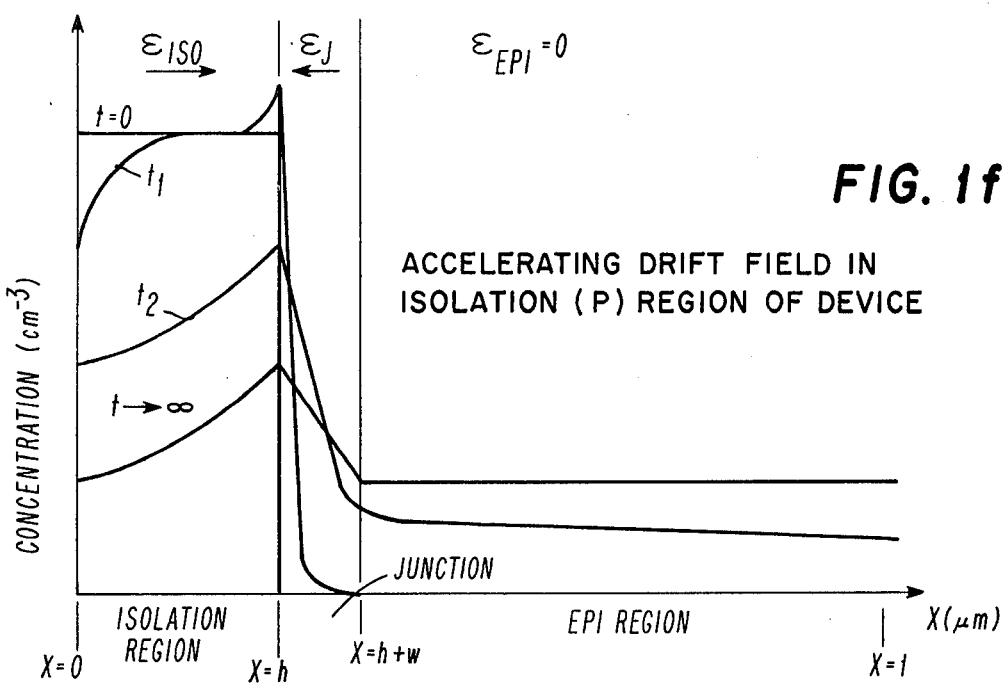
FIG. 1f shows the transient behavior of the contaminant for a forward biased junction when the depletion region has a moderate retarding field and the p region has an accelerating drift field.

Certain types of silicon integrated circuitry, e.g. bipolar gas panel driver devices, have diffused isolation regions 2 which become forward biased with respect to the conductivity type or epitaxial region 4, when sourcing current as described above for FIG. 1a. Metallic ionic impurities such as copper, gold, nickel and iron lodged in the isolation region 2 diffuse from the isolation region into the epitaxial region 4 during the forward bias condition. When the isolation region 2 is reverse biased, the impurities produce generation/recombination centers in the depletion region 6 of the device. This results in leakage current between the epitaxial region 4 and the isolation region 2.

Figure 2A:
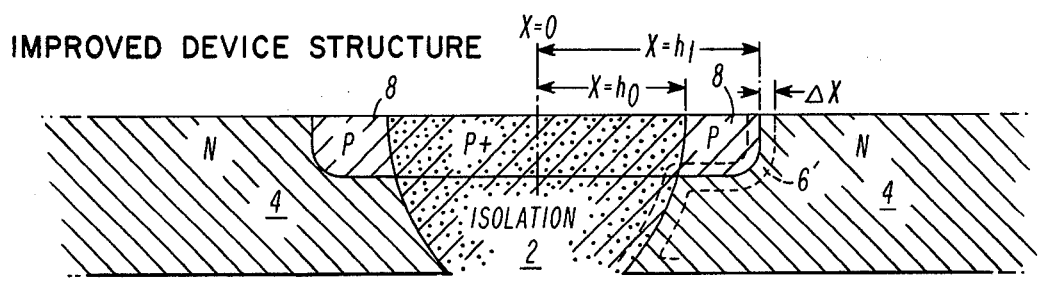
FIG. 2a is a cross-sectional view of the invention.
Figure 2B:
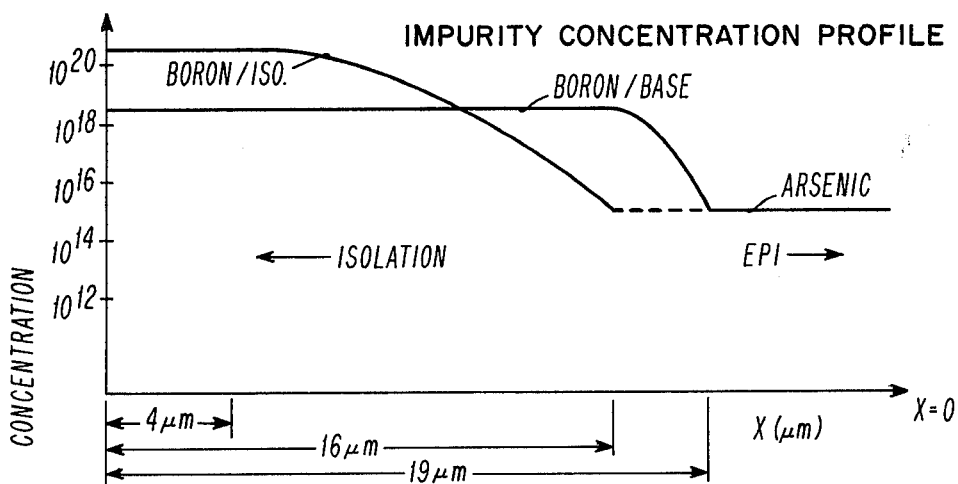

The invention disclosed herein prevents the leakage problem by adding a guard ring 8 to the isolation region 2 having the same conductivity type as the isolation region 2, as shown in FIG. 2a. This is done by the addition of a diffusion region having a lower surface concentration than that of the isolation region 2, for example, a base diffusion in bipolar technology, overlapping the isolation 2, such that the ohmic field does not extend back into the isolation region having a higher metallic contaminant concentration. The base diffusion region 8 contains very little contaminant because of the low boron concentration. The dopant concentration profiles are depicted in FIG. 2b. Region 8 can also be ion implanted.

Typically, for an arsenic doped epitaxial silicon layer 4, having a concentration of $10^{15}$ atoms/cc and a thickness of 12 microns and a boron doped isolation region 2 having a surface concentration of $2 \times 10^{20}$ atoms/cc and a width of 32 microns, the guard ring diffusion may be of boron at a concentration of approximately $10^{18}$ atoms/cc, which extends approximately 3 microns laterally beyond the edge of the isolation region 2. The surface concentration of the guard ring 8 is selected to be intermediate between that of the isolation region 2 and that of the epitaxial region 4. It must be high enough to prevent a substantial ohmic drop in the original isolation region 2 and also to displace the p-n junction 6, with its field $E_J$, beyond the original isolation region 2; yet it should not be so large so as to cause the metallic contaminant to redistribute itself into the guard ring 8 during its diffusion step.

Since the ohmic field does not extend back into the high contaminant concentration region, there is a relatively small transport of contaminant across the junction, resulting in very small degradation of forward and reverse bias junction characteristics. This can be accomplished even though the base diffusion is relatively shallow, since the contaminant concentration falls off rapidly with depth measured from the top of the isolation diffusion 2. Thus, the isolation region 2, below the base guard ring diffusion 8, is a poor source of copper and no degradation results in this region.

The guard ring 8 solves a serious problem in integrated circuit driver technology. In the absence of the guard ring, expanded circuitry is required for integrated circuit drivers. The problem of the isolation junction degrading from metallic contaminant diffusion under forward bias conditions has not previousy been addressed; hence this solution has application to linear or analog functions which are integrated into LSI.

While the invention has been particularly shown and described with reference to the preferred embodiments thereof, it will be understood by those skilled in the art that the foregoing and other changes in form and details may be made therein without departing from the spirit and the scope of the invention.

We claim:

1. A method of fabricating a semiconductor device so as to prevent forward biased epitaxial isolation junction degradation, comprising the steps of:

forming an isolation region of a first conductivity type having a width in a lateral direction and a first concentration in an epitaxial layer of a second conductivity type;

forming a guard ring of said first conductivity type having a second concentration less than said first concentration surrounding and contiguous with said isolation region extending beyond said isolation region in said lateral direction to prevent diffusion of ionic contaminants from said isolation region when the isolation region is forward biased relative to said epitaxial layer.

2. The structure of claim 1, wherein said first conductivity type is $n$ type and said second conductivity type is $p$ type.

3. The structure of claim 1, wherein said first conductivity type is $p$ type and said second conductivity type is $n$ type.

4. The method of claim 1, wherein the isolation guard ring is formed at the same time as a base region is formed adjacent the isolation region, in a bipolar transistor process.

5. The method of claim 1, wherein the isolation guard ring is formed by ion-implantation.

6. The method of claim 1, wherein the isolation guard ring is formed by thermal diffusion.

7. A method of fabricating a semiconductor device so as to prevent forward biased epitaxial isolation-junction degradation, comprising the steps of:

forming an isolation region of a first conductivity type having a first width in a lateral direction and a first concentration in an epitaxial layer of a second conductivity type having a second concentration;

forming a guard ring of said first conductivity type having a third concentration approximately midway between said first concentration and said second concentration, about said isolation region extending beyond said isolation region in said lateral direction to prevent diffusion of ionic contaminants from said isolation region when the isolation region is forward biased relative to said epitaxial layer.

8. The method of claim 7 wherein said first concentration is greater than $10^{19}$ atoms per cubic centimeter of boron.

9. The method of claim 7, wherein said isolation region of said first conductivity type is formed of silicon doped with boron with said first concentration being greater than $10^{19}$ atoms per cubic centimeter, said epitaxial layer being a silicon epitaxial layer doped with arsenic with said second concentration being approximately $10^{15}$ atoms per cubic centimeter and said guard ring being formd of silicon doped with boron with said third concentration being approximately midway between said first concentration and said second concentration.

* * * * *